US008678524B2

(12) United States Patent
Green

(10) Patent No.: US 8,678,524 B2
(45) Date of Patent: Mar. 25, 2014

(54) SPRING-LOADED DOOR DEVICE FOR SERVER RACK

(76) Inventor: Joseph R. Green, Springfield, VA (US)

( * ) Notice: Subject to any disclaimer, the term of this patent is extended or adjusted under 35 U.S.C. 154(b) by 60 days.

(21) Appl. No.: 13/106,011

(22) Filed: May 12, 2011

(65) Prior Publication Data

US 2012/0285096 A1 Nov. 15, 2012

(51) Int. Cl.
*H05K 7/20* (2006.01)
*A47B 97/00* (2006.01)

(52) U.S. Cl.
USPC ............... 312/223.2; 312/319.1; 312/329; 361/679.46

(58) Field of Classification Search
USPC .......... 312/326, 327, 328, 329, 319.1, 319.2, 312/223.1, 223.2, 291; 361/724, 725, 726, 361/727, 679.01, 679.02; 211/26, 47, 45, 211/82, 168, 169; 49/386, 387
See application file for complete search history.

(56) References Cited

U.S. PATENT DOCUMENTS

| | | | | | |
|---|---|---|---|---|---|
| 2,304,465 | A | * | 12/1942 | Maniscalco | 62/329 |
| 2,645,743 | A | * | 7/1953 | De Smidt | 200/293 |
| 2,803,512 | A | * | 8/1957 | Band | 312/298 |
| 3,240,862 | A | * | 3/1966 | Merkl et al. | 174/371 |
| 5,091,827 | A | * | 2/1992 | Suret et al. | 361/818 |
| 5,442,513 | A | * | 8/1995 | Lo | 361/679.35 |
| 5,875,521 | A | | 3/1999 | Woo | |
| 6,597,576 | B1 | * | 7/2003 | Smith et al. | 361/724 |
| 6,878,891 | B1 | * | 4/2005 | Josten et al. | 200/293 |
| 7,506,768 | B2 | | 3/2009 | Rassmussen et al. | |
| 8,113,599 | B2 | * | 2/2012 | Klassen et al. | 312/109 |
| 2003/0200623 | A1 | * | 10/2003 | Hung | 16/50 |
| 2005/0157472 | A1 | | 7/2005 | Malone et al. | |
| 2011/0053485 | A1 | * | 3/2011 | Huang et al. | 454/184 |
| 2011/0291852 | A1 | * | 12/2011 | Forristal et al. | 340/686.1 |
| 2012/0020012 | A1 | * | 1/2012 | Chang et al. | 361/679.46 |
| 2012/0132598 | A1 | * | 5/2012 | Wang et al. | 211/26 |

FOREIGN PATENT DOCUMENTS

GB 2345385 A * 7/2000

* cited by examiner

*Primary Examiner* — Darnell Jayne
*Assistant Examiner* — Andres F Gallego
(74) *Attorney, Agent, or Firm* — Michael L. Greenberg, Esq.; Greenberg & Lieberman, LLC

(57) ABSTRACT

A spring-loaded door device that fastens to the front of a server rack in order to prevent airflow from exiting through an unfilled space in the server rack. An equipment module can then be inserted through the spring-loaded door device and mounted to the server rack. When the equipment module is removed from the server rack, the spring-loaded door closes to prevent airflow from exiting through the unfilled space in the server rack.

3 Claims, 6 Drawing Sheets

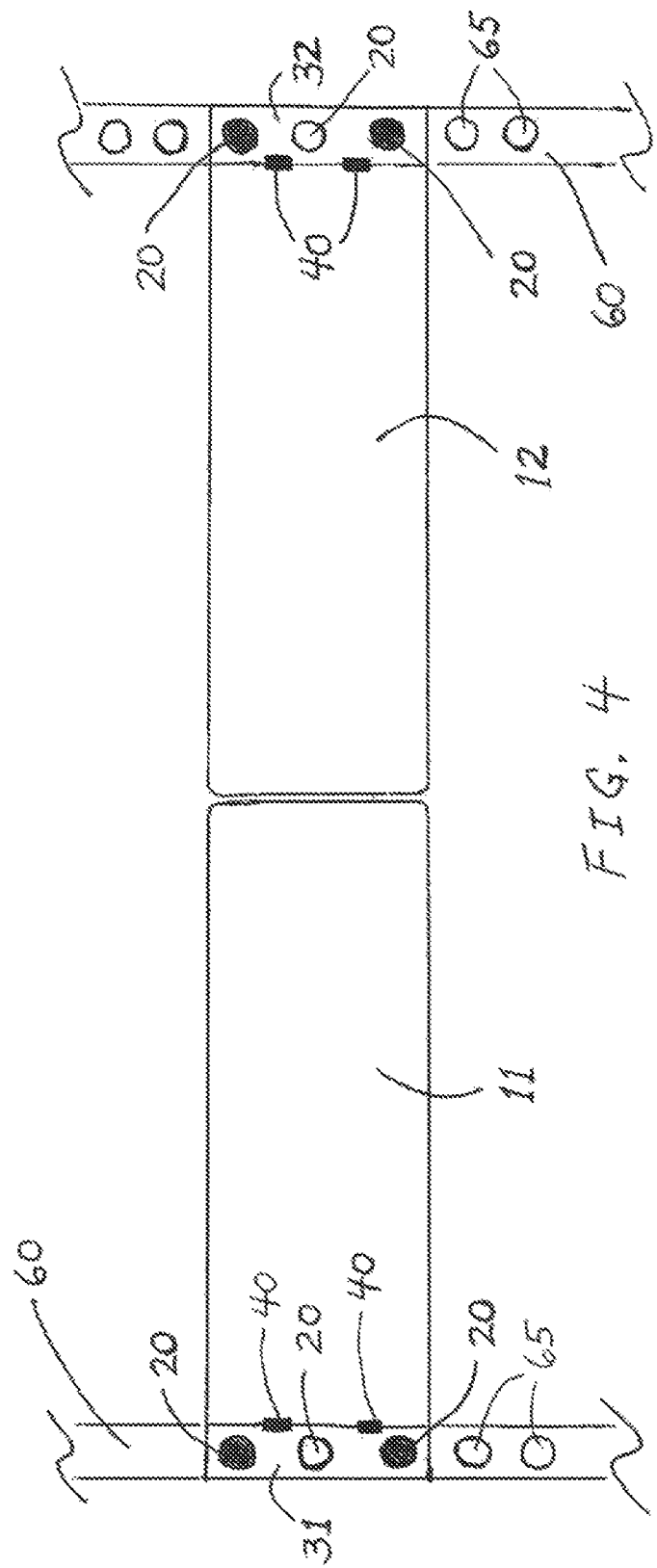

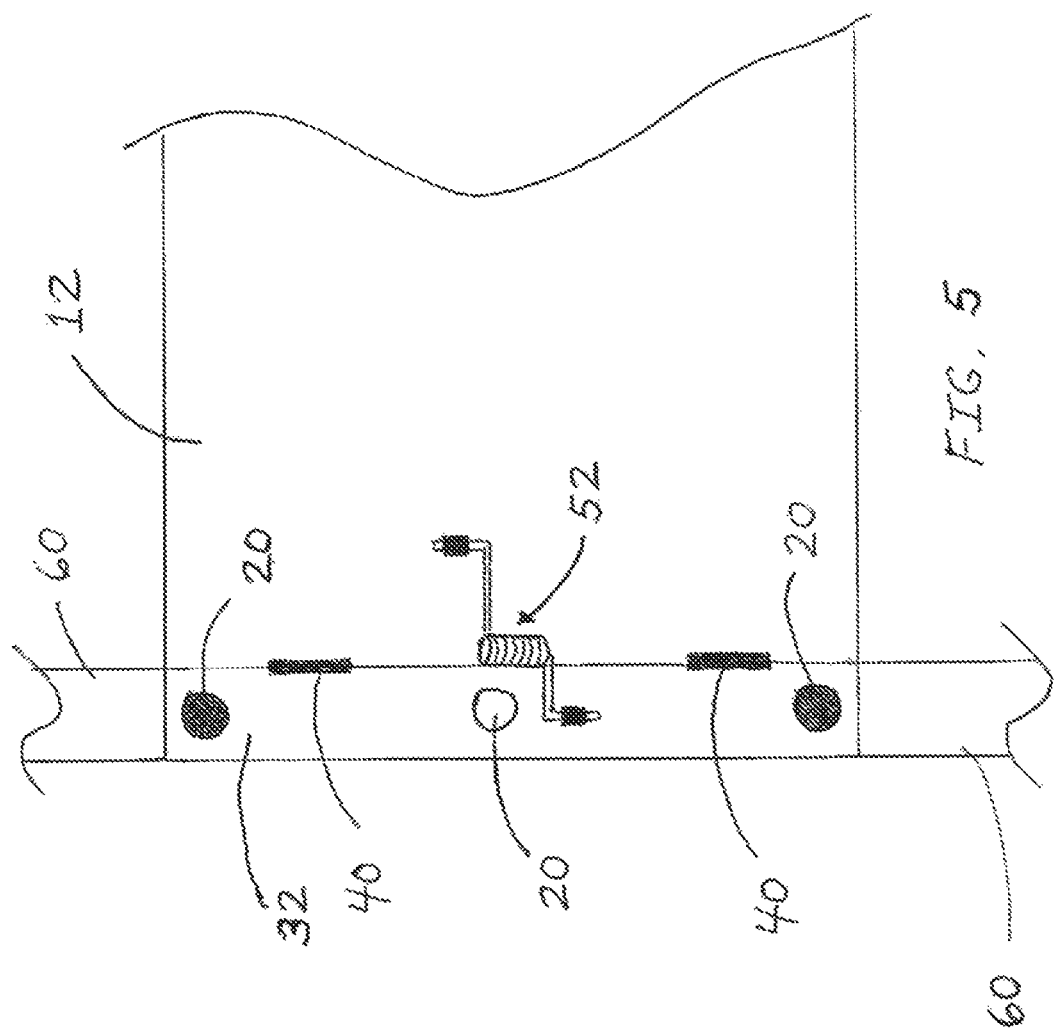

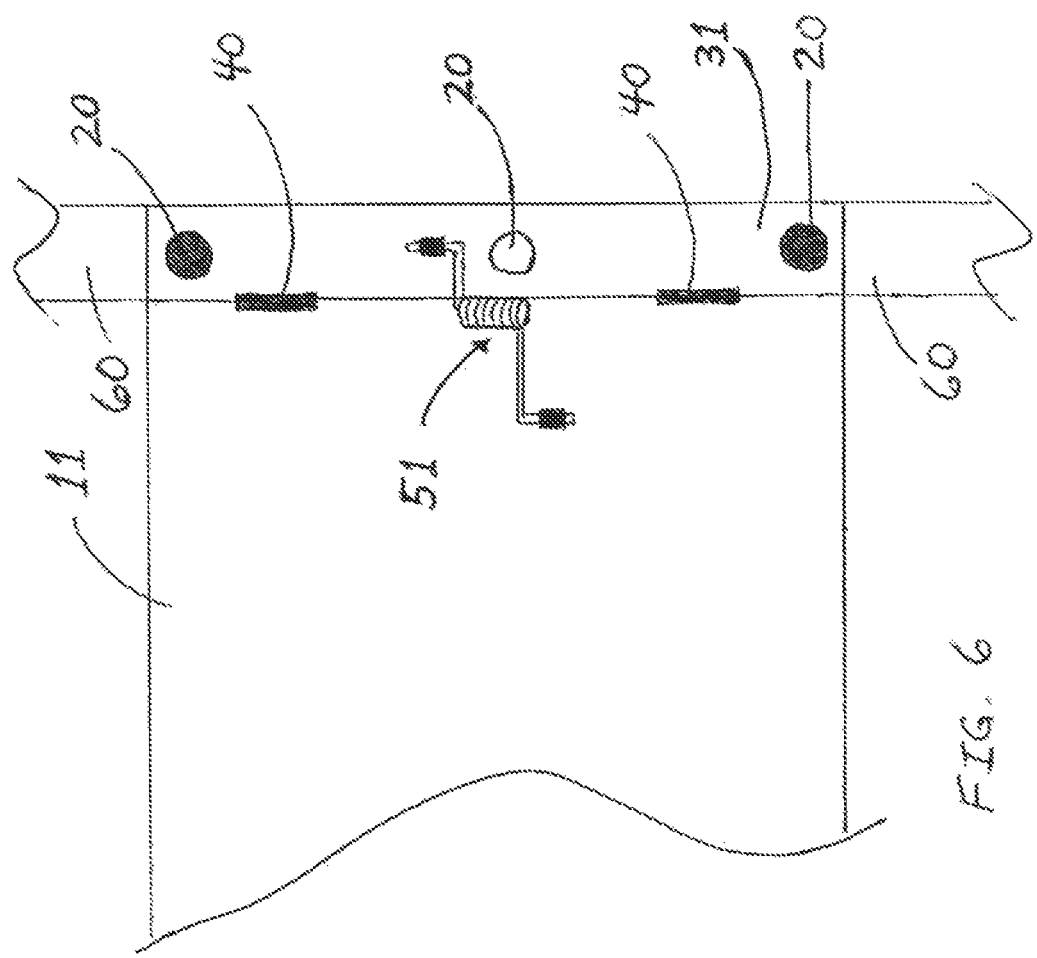

US 8,678,524 B2

SPRING-LOADED DOOR DEVICE FOR SERVER RACK

FIELD OF THE INVENTION

Figure 1:
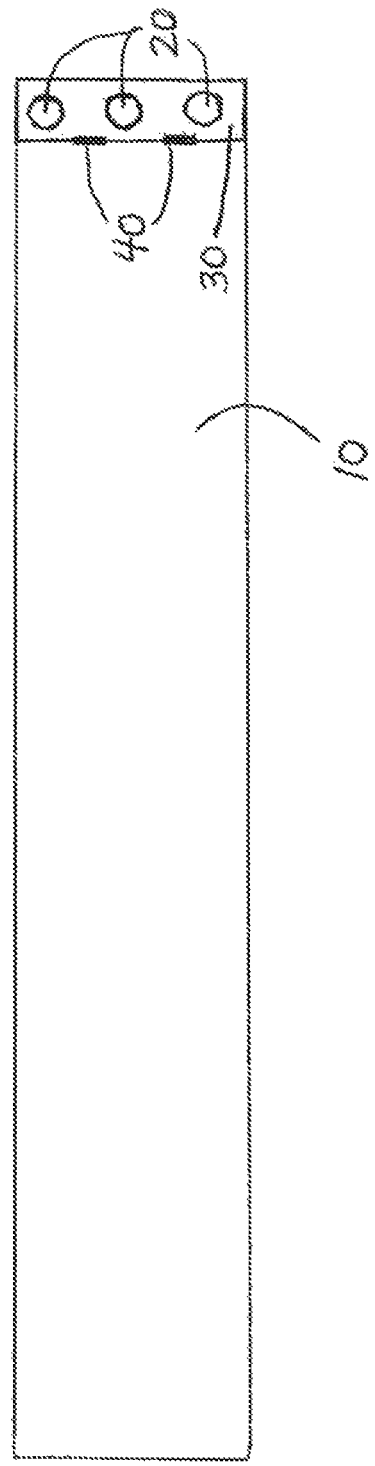

The present invention is a spring-loaded door device that fastens to the front of a server rack in order to prevent airflow from exiting through an unfilled space in the server rack. An equipment module can then be inserted through the spring-loaded door device and mounted to the server rack. When the equipment module is removed from the server rack, the spring-loaded door of the present invention closes to prevent airflow from exiting through the unfilled space in the server rack.

BACKGROUND OF THE PRESENT INVENTION

Server racks are standardized frames or enclosures for mounting multiple equipment modules such as professional audio and video equipment, computer server equipment, and industrial power, control, and automation hardware. Server racks allow for dense hardware configurations without occupying excessive floor space or requiring shelving.

The present invention is a device with a spring-loaded door, designed to cover one or more unfilled spaces in a server rack. Devices known as filler panels are currently in use, these panels attaching to a server rack in order to cover one or more unfilled spaces in the server rack. The present invention serves the same purpose as a filler panel, that purpose being to restrict airflow in order to make the cooling of equipment in the server rack more efficient. However, unlike a filler panel, the present invention does not need to be removed when a user places an equipment module into the server rack. Instead, the user inserts the equipment module through the spring-loaded door of the present invention, then fastens the equipment module onto the server rack. When the user removes the equipment module from the server rack, the spring-loaded door of the present invention will close. No filler panel need be removed or attached by the user.

U.S. Publication No. 2005/0157472 for "Slot Filler with Capability to Control Electronic Cooling Air Recirculation" by Malone et al., published on Jul. 21, 2005, shows a slot filler for usage in a rack cabinet that can accept a number of stacked electronic modules. Unlike the present invention, Malone et al. comprises a filler panel that covers the entry opening of an open slot, connected to a "body" with dimensions similar to those of a standard-size electronic module.

U.S. Pat. No. 7,506,768 issued to Rassmussen et al. on Mar. 24, 2009 is for a filler panel for an equipment rack or enclosure. Rassmussen et al. is designed for use with equipment racks that house electronic modules, and configured such that when the filler panel is installed into the rack, an air seal is formed to prevent cooling air from exiting the rack. Unlike the present invention, Rassmussen et al. requires installation and removal from the rack as needs dictate, whereas the present invention is installed into the rack only once, then opens and closes as needed.

U.S. Pat. No. 5,875,521 issued to Woo on Mar. 2, 1999 is for an apparatus for operating a front door of a videocassette recorder (VCR). Woo's invention is designed to enable the front door of a VCR to pivot inward and outward with respect to the VCR. Unlike the present invention, Woo's device is intended solely for a VCR and employs electronic sensors to open and close the VCR door, unlike the present invention which opens and closes without electronic means.

SUMMARY OF THE PRESENT INVENTION

The present invention is a device with a spring-loaded door for placement onto a conventional server rack. The present invention is designed to cover one or more unfilled spaces in the server rack in order to restrict airflow out of the server rack, making the cooling of electronic modules in the server rack more efficient.

The present invention is mounted to the server rack via a mounting piece that attaches to the server rack. Also attached to the mounting piece are two conventional hinges that connect the mounting piece to the door, and a conventional spring (placed on the rear of the present invention) connected to both the mounting piece and the door. When an electronic module is inserted into the server rack through the door of the present invention, the door swings open into the server rack like a gate, and the user then mounts the electronic module to the server rack. When the electronic module is removed from the server rack, the door of the present invention swings back into a closed position in order to cover the unfilled space in the server rack. Other embodiments of the present invention are envisioned using two mounting pieces and two half-size doors in order to cover an unfilled space in the server rack.

The present invention is designed to be installed on a server rack manufactured according to strict size specifications. The standard size of a server rack front panel is 19 inches wide, including edges that allow an equipment module to be fastened to the server rack frame with screws. The height of an equipment module is standardized as a multiple of 1.75 inches, or one rack unit (one rack unit is 1.75 inches high). The size of an equipment module is frequently described as a number in "U". For example, one rack unit is often referred to as 1U, 2 rack units as 2U, and so on. Because the size of server racks and equipment modules is highly standardized, it is essential that the present invention be sized to precise specifications. The present invention is envisioned in embodiments of different sizes, such as 1U, 2U, 3U and 4U.

Typically, a 1U size equipment module installed in a server rack has a front panel height of 1.734 inches instead of 1.75 inches. An equipment module of 2U size would be 3.469 inches instead of 3.5 inches, and so on. This gap allows a bit of room above and below an installed equipment module so that it may be installed and removed without contacting the adjacent equipment modules. The design of the present invention takes these strict size measurements into account.

DETAILED DESCRIPTION OF THE PRESENT INVENTION

FIG. 1 shows a front view of the present invention in its preferred embodiment, designed for a 1U size equipment module. This embodiment of the present invention is designed for placement in a 1U size space within a server rack (not shown in FIG. 1). The mounting piece (30), with its three mounting holes (20), is shown attached to the door (10) by means of conventional hinges (40).

Figure 2:
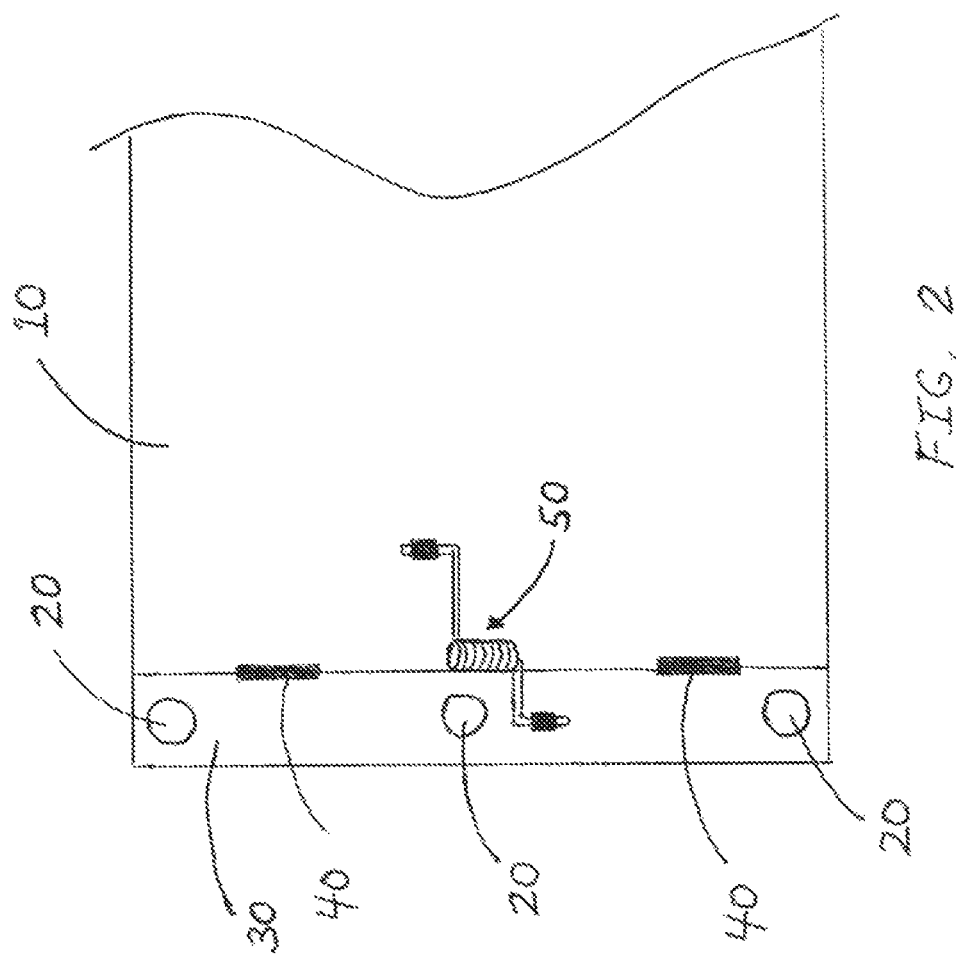

FIG. 2 shows a rear view of the hinged and spring-loaded portion of the preferred embodiment of the present invention. FIG. 2 focuses on the interaction of the mounting piece (30) with the door (10). The two conventional hinges (40) are shown connecting the door (10) to the mounting piece (30). A spring (50) is also shown, the spring (50) attached in a conventional manner to both the door (10) and the mounting piece (30) in order to close the door (10) when an electronic module is removed from the server rack (not shown in FIG. 2). Also shown in FIG. 2 are the mounting holes (20) through which the present invention is attached to the server rack (not shown in FIG. 2). This configuration of hinges (40), spring (50), door (10) and mounting piece (30) is intended for use in all embodiments of the present invention, although other configurations may be used as well.

Figure 3:
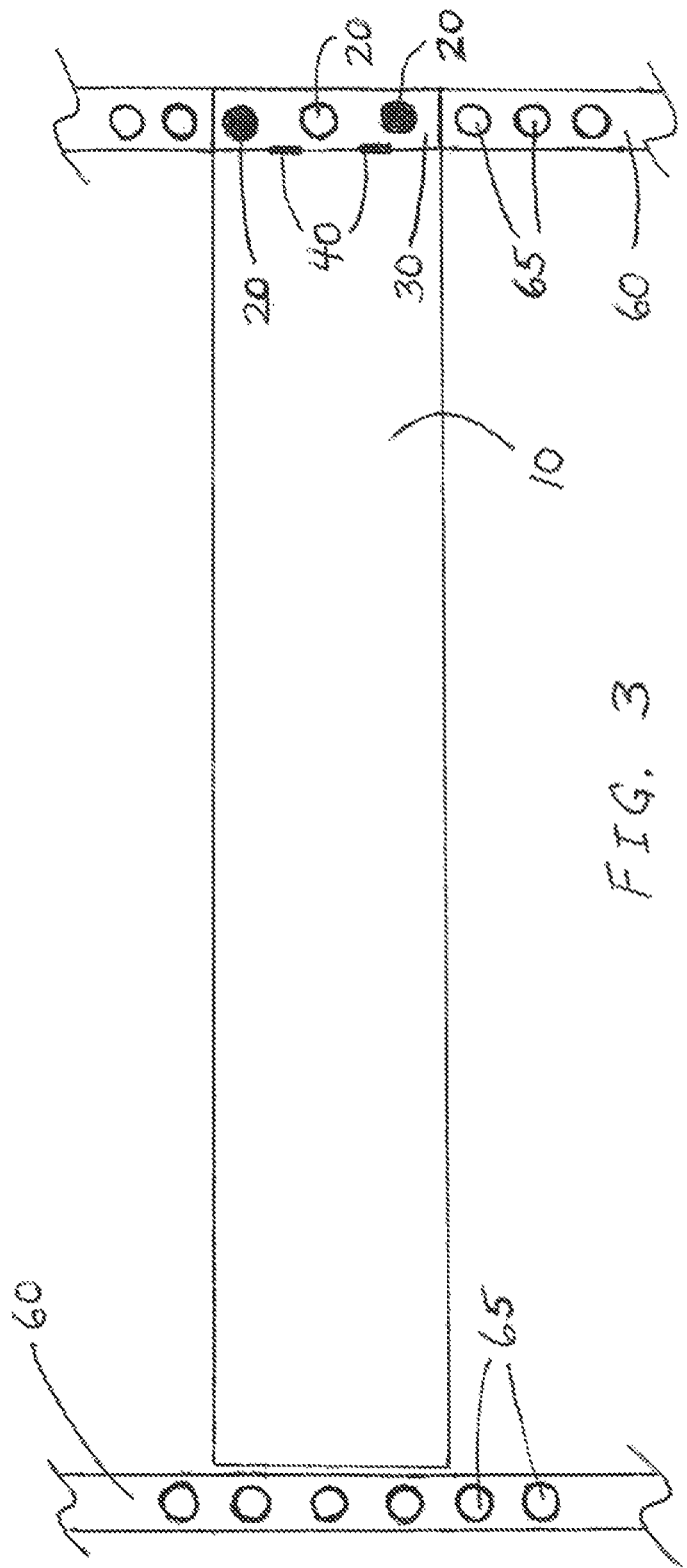

FIG. 3 shows a front view of the preferred embodiment of the present invention inserted into a server rack (60). The mounting piece (30) of the present invention is fastened to screw holes (65) in the server rack (60) through two of the three mounting holes (20) of the mounting piece (30). The door (10) of the present invention is attached to the mounting piece (30) by means of the hinges (40). A 1U size equipment module (not shown) can be inserted through the door (10), which will swing open on its hinges (40), and the equipment module (not shown) can be fastened to the server rack (60) through a mounting hole (20) of the mounting piece (30). The conventional spring (50) (see FIG. 2) serves to close the door (10) when the equipment module is removed from the server rack (60).

FIG. 4 shows a front view of another embodiment of the present invention designed for a 1U size equipment module. This embodiment of the present invention is also designed for placement in a 1U size space within a server rack (60). This embodiment covers the same amount of space in a server rack (60) as does the preferred embodiment, but instead uses a first door (11) and a second door (12). These two doors (11 and 12) are the same height and thickness as the preferred embodiment's door (10) (see FIG. 1), but these doors (11 and 12) are half as wide. As shown in FIG. 4, the first door (11) is attached to the first mounting piece (31) by means of conventional hinges (40), and the second door (12) is attached to the second mounting piece (32) by means of conventional hinges (40). The first mounting piece (31) and the second mounting piece (32) are fastened to screw holes (65) in the server rack (60) through the mounting holes (20) in the mounting pieces (31 and 32). Then a 1U size equipment module (not shown) is inserted through the doors (11 and 12) that swing open on their hinges (40), and the equipment module (not shown) is fastened to the server rack (60) through mounting holes (20) of the mounting pieces (31 and 32). A first spring (51) (see FIG. 5) and second spring (52) (see FIG. 6) serve to close the doors (11 and 12) when the equipment module is removed from the server rack (60).

FIG. 5 shows a rear view of the embodiment shown in FIG. 4, focusing on the second mounting piece (32) connected to the second door (12) and fastened to the server rack (60) through two of the mounting holes (20) of the second mounting piece (32). Also shown is the mounting hole (20) through which the electronic module (not shown) will be attached to the server rack (60). The two hinges (40) are shown connecting the second door (12) to the second mounting piece (32). The second spring (52) is also shown, the second spring (52) attached in a conventional manner to both the second door (12) and the second mounting piece (32) in order to close the second door (12) when an electronic module (not shown) is removed from the server rack (60).

FIG. 6 shows another rear view of the embodiment shown in FIG. 4, focusing on the first mounting piece (31) connected to the first door (11) and fastened to the server rack (60) through two of the mounting holes (20) of the first mounting piece (31). Also shown is the mounting hole (20) through which the electronic module (not shown) will be attached to the server rack (60). The two hinges (40) are shown connecting the first door (11) to the first mounting piece (31). The first spring (51) is also shown, the first spring (51) attached in a conventional manner to both the first door (11) and the first mounting piece (31) in order to close the first door (11) when an electronic module (not shown) is removed from the server rack (60).

Other embodiments of the present invention are also envisioned, for placement into 2U, 3U, 4U, or larger sized spaces in a server rack.

In summary, the present invention in the preferred embodiment is a door device for a server rack (60), comprising a mounting piece (30) configured to be attached to the server rack (60) by means of mounting holes (20), a door (10) affixed to the mounting piece (30) by means of hinges (40), a spring (50) attached to the mounting piece (30) and the door (10), the door (10) configured to open on the hinges (40) when an electronic module is inserted through the door (10) into the server rack (60), the mounting holes (20) configured to receive the electronic module for fastening to the server rack (60), the spring (50) configured to close the door (10) on the hinges (40) when the electronic module is removed from the server rack (60), and the door (10) configured to close on the hinges (40) when the electronic module is removed from the server rack (60).

In another embodiment, the present invention is a door device for a server rack (60), comprising a first mounting piece (31) configured to be attached to the server rack (60) by means of mounting holes (20), a first door (11) affixed to the first mounting piece (31) by means of hinges (40), a second mounting piece (32) configured to be attached to the server rack (60) by means of the mounting holes (20), a second door (12) affixed to the second mounting piece (32) by means of hinges (40), a first spring (51) attached to the first mounting piece (31) and the first door (11), a second spring (52) attached to the second mounting piece (32) and the second door (12), the first door (11) and the second door (12) configured to open on the hinges (40) when an electronic module is inserted through the first door (11) and the second door (12) into the server rack (60), the electronic module configured to fasten to the server rack (60) through at least one of the mounting holes (20) placed in the first mounting piece (31) and the second mounting piece (32), and the first door (11) and the second door (12) configured to close on the hinges (40) when an electronic module is removed from the server rack (60).

Furthermore, the present invention is a door device for a server rack (60), comprising a mounting piece (30) having mounting holes (20), at least one hinge (40) attached to the mounting piece (30), and a door (10) attached to at least one hinge (40), wherein one of the mounting holes (20) is not used for securing the mounting piece (30) to the server rack (60), the mounting holes (20) number three, the door (10) is configured to attach to only one mounting piece (30) via at least one hinge (40), the mounting piece (30) is configured to extend the width of the server rack (60), the mounting piece (30) is configured to extend half the width of the server rack (60), the mounting piece (30) is configured to extend half the width of the server rack (60) such that it meets an identical mounting piece (30) extending across the other half of the width of the server rack (60), and further comprising a spring (50) attached to the mounting piece (30) and the door (10).

I claim:

1. A door device for a server rack, comprising:
   a mounting piece configured to be attached to a front of the server rack by means of mounting holes;
   a door affixed to said mounting piece via hinges;
   a spring attached to said mounting piece and said door;
   said spring is biased toward maintaining said door in a closed position covering a space in the server rack;
   said door configured to open on said hinges and to be held open on said hinges into the server rack when an electronic module is inserted through said door into said space in the server rack and the electronic module remains in the server rack;
   said mounting holes configured to receive the electronic module for fastening to the server rack;

said spring configured to close said door on said hinges when the electronic module is removed from said space in the server rack;
said door configured to close on said hinges and to be closed via said spring out from the server rack when the electronic module is removed from the server rack;
wherein said door is one of a series of doors arranged one above another on the server rack; and
wherein air flow in the server rack is preserved by said series of doors remaining closed over a series of the space in the server rack when the electronic module is not inserted through said series of doors.

2. A door device for a server rack, comprising:
a first mounting piece configured to be attached to a front of the server rack by means of mounting holes;
a first door affixed to said first mounting piece via a first hinges;
a second mounting piece configured to be attached to the server rack by means of said mounting holes;
a second door affixed to said second mounting piece via a second hinge;
a first spring attached to said first mounting piece and said first door, said first spring biased toward maintaining said first door in a closed position covering a space in the server rack;
a second spring attached to said second mounting piece and said second door, said second spring biased toward maintaining said second door in a closed position covering said space in the server rack;
said first door and said second door arranged on the front of the server rack across from one another;
said first door configured to open on said first hinge and said second door configured to open on said second hinge when an electronic module is inserted through said first door and said second door into the server rack;
the electronic module configured to fasten to the server rack through at least one of said mounting holes placed in said first mounting piece and said second mounting piece;
said first door configured to close on said first hinge and said second door configured to close on said second hinge when the electronic module is removed from the server rack;
wherein said first door and said second door are one of a series of door pairs, each door pair arranged one above another on the server rack; and
wherein air flow in the server rack is preserved by said series of door pairs remaining closed over a series of the space in the server rack when the electronic module is not inserted through said series of said door pairs.

3. A method for restricting the air flow within a server rack comprising:
mounting a first door to a first side of a first space within the server rack;
securing the first door to the first side of the first space within the server rack with a first mounting piece configured to be attached to a front of the server rack by means of mounting holes;
mounting a second door to a second side of the first space within the server rack;
securing the second door to the second side of the first space within the server rack with a second mounting piece configured to be attached to the front of the server rack by means of the mounting holes;
the first door and the second door mounted at the same height on the server rack across from one another, the first door and the second door closing via springs to cover the first space;
inserting a first server component into the first space, pushing the first door and the second door inward;
mounting the server component to the server rack by means of the mounting holes;
mounting a third door to a first side of a second space within the server rack;
securing the third door to the first side of the second space within the server rack with a third mounting piece configured to be attached to the front of the server rack by means of the mounting holes;
mounting a fourth door to a second side of the second space within the server rack;
securing the fourth door to the second side of the second space within the server rack with a fourth mounting piece configured to be attached to the front of the server rack by means of the mounting holes;
the third door and the fourth door mounted at the same height on the server rack across from one another, the third door and the fourth door closing via springs to cover the second space;
inserting a second server component into the second space, pushing the third door and the fourth door inward;
mounting the second server component to the server rack by means of the mounting holes;
wherein the first door is positioned above and in line with the third door;
wherein the second door is positioned above and in line with the fourth door;
forcing an airflow through the server rack;
the first door and the second door preventing the airflow from escaping from the server rack when the first server component is removed from the server rack; and
the third door and the fourth door preventing the airflow from escaping from the server rack when the second server component is removed from the server rack.

\* \* \* \* \*